(12) United States Patent
Shibata et al.

(10) Patent No.: US 8,410,962 B2
(45) Date of Patent: Apr. 2, 2013

(54) ACTIVE RC RESONATORS WITH ENHANCED Q FACTOR

(75) Inventors: Hajime Shibata, Toronto (CA); Richard Schreier, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 186 days.

(21) Appl. No.: 13/009,015

(22) Filed: Jan. 19, 2011

(65) Prior Publication Data

US 2012/0182168 A1 Jul. 19, 2012

(51) Int. Cl.
*H03M 3/00* (2006.01)

(52) U.S. Cl. ........ 341/143; 341/155; 327/336; 327/551; 327/553; 327/559

(58) Field of Classification Search .................. 341/143, 341/155; 327/336, 551, 553, 559
See application file for complete search history.

(56) References Cited

U.S. PATENT DOCUMENTS

| | | | | |
|---|---|---|---|---|
| 5,172,076 A * | 12/1992 | Brown | ............................. | 331/57 |
| 5,729,230 A * | 3/1998 | Jensen et al. | .................... | 341/143 |
| 5,880,634 A * | 3/1999 | Babanezhad | ................. | 330/126 |
| 5,982,315 A * | 11/1999 | Bazarjani et al. | ............. | 341/143 |
| 7,180,364 B2 * | 2/2007 | Kimura | .......................... | 327/553 |
| 7,408,494 B2 * | 8/2008 | Mitteregger | .................. | 341/143 |
| 7,840,199 B2 * | 11/2010 | Krishnaswamy et al. | ..... | 455/147 |
| 7,902,916 B2 * | 3/2011 | Jeong | ............................. | 327/554 |
| 2001/0022535 A1 * | 9/2001 | Stikvoort | ...................... | 330/303 |
| 2008/0297385 A1 * | 12/2008 | Clara et al. | ..................... | 341/143 |
| 2009/0039955 A1 * | 2/2009 | Hosoya | ......................... | 327/553 |
| 2009/0146735 A1 * | 6/2009 | Jeong | ............................. | 327/554 |
| 2009/0243726 A1 * | 10/2009 | Kojima | ......................... | 330/282 |

* cited by examiner

*Primary Examiner* — Linh Nguyen
(74) *Attorney, Agent, or Firm* — Kenyon & Kenyon LLP

(57) ABSTRACT

An active RC resonator includes a first operational amplifier having first and second inputs and first and second outputs, a second operational amplifier having first and second inputs and first and second outputs, a first resistor coupled between the first input of the first operational amplifier and the second output of the second operational amplifier, a second resistor coupled between the second input of the first operational amplifier and the first output of the second operational amplifier, a third resistor coupled between the first output of the first operational amplifier and the first input of the second input of the second operational amplifier, a fourth resistor coupled between the second output of the first operational amplifier and the second input of the second operational amplifier, and at least one of 1) a first capacitor coupled between the first input of the first operational amplifier and the first output of the second operational amplifier, and a second capacitor coupled between the second input of the first operational amplifier and the second output of the second operational amplifier, 3) a third capacitor coupled between the second output of the first operational amplifier and the first input of the second operational amplifier, and a fourth capacitor coupled between the first output of the first operational amplifier and the second input of the second operational amplifier.

16 Claims, 6 Drawing Sheets

ACTIVE RC RESONATORS WITH ENHANCED Q FACTOR

FIELD OF THE INVENTION

The present invention is directed to systems for enhancing the Q factor of active RC resonators, in particular, RC resonators used in active RC filters.

BACKGROUND INFORMATION

Analog-to-digital converters (ADCs) may include loop filters that may be tunable low-pass or band-pass filters. FIG. 1 illustrates an exemplary Sigma-Delta Modulation (SDM) type of ADC 100 as commonly used in the art. As shown in FIG. 1, the SDM ADC may include a forward signal path and a feedback signal path. The forward signal path may include a loop filter 20, a resonator 24, a summer 26, and a flash ADC 28. The loop filter 20 may further include three additional resonators 14, 16, 18. The feedback signal path may include an element selection logic 36, digital-to-analog converters 30, 32, 34 through which the digital output signal may be coupled to the forward signal path respectively through adders 12, 22 and summer 26.

Commonly, the loop filter 20 may have a center frequency f0 that may be tunable in a frequency range as wide as from DC to 1 GHz. To achieve the wide range of tunable center frequencies, resonators 14, 16, 18 inside the loop filter 20 may be designed to be widely tunable. The first resonator 14 may be switched from an active RC resonator for f0<200 MHz to an LC resonator for f0≧200 MHz. The second resonator 16 and the third resonator 18 may be active RC resonators with both the resistor R and capacitor C being tunable so that the center frequency f0 of the overall loop filter may be in a range from approximately DC to approximately 1 GHz.

A resonator may be characterized by a quality factor (or Q factor) which may measure how under-damped the resonator may be. The Q factor also may be measured in terms of the bandwidth of the resonator relative to the resonance frequency of the resonator. In general, a resonator having a higher Q factor may be more efficient and therefore more desirable. For example, for a resonator having a resonance frequency of approximately 1 GHz, it may be desirable that the Q factor is greater than 30.

The resonance frequency of a tunable active RC resonator may be tuned through tunable resistors and/or tunable capacitors. Commonly, the tunable resistors and tunable capacitors may be implemented with digitally-controlled MOSFET switches. These MOSFET components may introduce parasitic components having parasitic capacitance or parasitic resistance into the active RC resonator circuitry. These parasitic components may degrade the Q factor of the active RC resonator. Therefore, there is a need for systems and methods that may counter the Q factor degradation caused by these parasitic components and thus enhance the Q factor of the active RC resonator.

DETAILED DESCRIPTION OF EXAMPLE EMBODIMENTS

Figure 1:
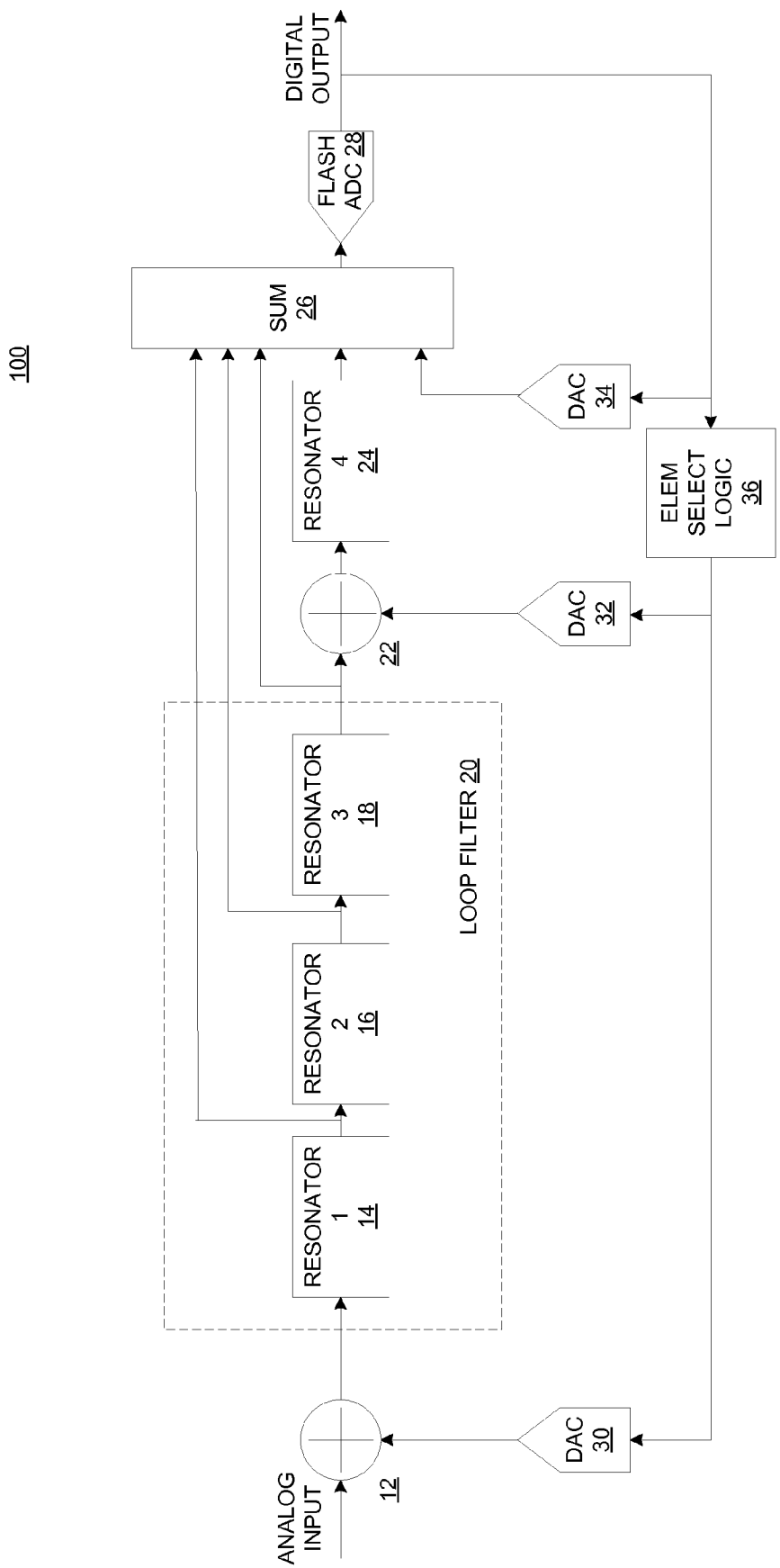
FIG. 1 illustrates an analog-to-digital converter (ADC) including a loop filter.

Embodiments of the present invention may be directed to an active RC resonator. The active RC resonator may include a first differential integrator and a second differential integrator where first and second inputs of the first differential integrator are respectively coupled to second and first outputs of the second differential integrator via first and second signal paths, and first and second outputs of the first differential integrator are respectively coupled to a first and second inputs of the second differential integrator via third and fourth signal paths, and at least one of 1) a first capacitor coupled from the first output of the second differential integrator to the first input of the first differential integrator, and a second capacitor coupled from the second output of the second differential integrator to the second input of the first differential integrator, 2) a third capacitor coupled from the first output of the first differential integrator to the second input of the second differential integrator, and a fourth capacitor coupled from the second output of the first differential integrator to the first input of the second differential integrator.

Embodiments of the present invention may be directed to an active RC resonator. The active RC resonator may include a first operational amplifier having first and second inputs and first and second outputs, a second operational amplifier having first and second inputs and first and second outputs, a first resistor coupled between the first input of the first operational amplifier and the second output of the second operational amplifier, a second resistor coupled between the second input of the first operational amplifier and the first output of the second operational amplifier, a third resistor coupled between the first output of the first operational amplifier and the first input of the second input of the second operational amplifier, a fourth resistor coupled between the second output of the first operational amplifier and the second input of the second operational amplifier, and at least one of 1) a first capacitor coupled between the first input of the first operational amplifier and the first output of the second operational amplifier, and a second capacitor coupled between the second input of the first operational amplifier and the second output of the second operational amplifier, 2) a third capacitor coupled between the second output of the first operational amplifier and the first input of the second operational amplifier, and a fourth capacitor coupled between the first output of the first operational amplifier and the second input of the second operational amplifier. The active RC resonator may further include a first integration capacitor coupled between the first input of the first operational amplifier and the first output of the first operational amplifier, a second integration capacitor coupled between the second input of the first operational amplifier and the second output of the first operational amplifier, a third integration capacitor coupled between the first input of the second operational amplifier and the first output of the second operational amplifier, and a fourth integration capacitor coupled between the second input of the second operational amplifier and the second output of the second operational amplifier.

Figure 2:
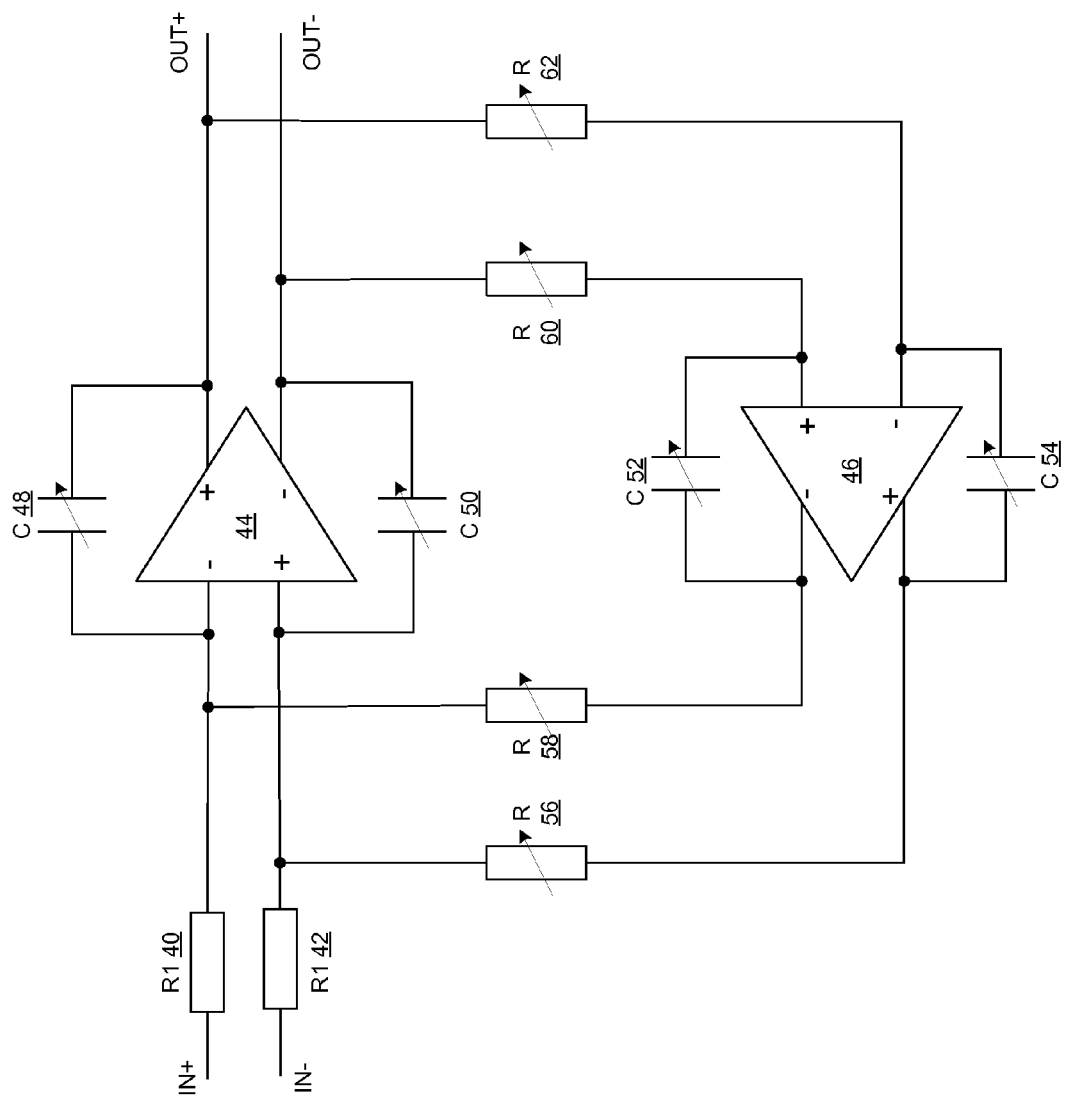
FIG. 2 illustrates an active RC resonator.

FIG. 2 illustrates an active RC resonator of the current art. The active RC resonator 200 may include first and second operational amplifiers 44, 46, resistors 40, 42, 56, 58, 60, 62, and capacitors 48, 50, 52, 54. The first operational amplifier 44 may have a first input (+) and a second input (−), and a first output (−) and a second output (+). Similarly, the second operational amplifier 46 may have a first input (+) and a second input (−), and a first output (−) and a second output (+). The capacitor 50 may be coupled between the first input and the first output of the first operational amplifier 44, and the capacitor 48 may be coupled between the second input and the second output of the first operational amplifier 44. The operational amplifier 44 and the capacitors 48, 50 as such connected may form a first integrator. Similarly, the capacitor 52 may be coupled between the first input and the first output of the second operational amplifier 46, and the capacitor 54 may be coupled between the second input and the second output of the second operational amplifier 46. The operational amplifier 46 and the capacitors 52, 54 as such connected may form a second integrator. The outputs of first integrator may be connected to the inputs of the second integrator, and the outputs of the second integrator may be coupled to the inputs of the first integrator to form a resonating loop. Thus, the first output of the first operational amplifier 44 may be coupled to the first input of the second operational amplifier 46 via resistor 60. The second output of the first operational amplifier 44 may be coupled to the second input of the second operational amplifier 46 via resistor 62. The first output of the second operational amplifier 46 may be coupled to the second input of the first operational amplifier 44 via resistor 58. The second output of the second operational amplifier 46 may be coupled to the first input of the first operational amplifier 44 via resistor 56. The resistors 40, 42 may be inter-stage resistors that may be respectively coupled from a previous stage (such as another resonator) to the current stage of the resonator.

Figure 3:
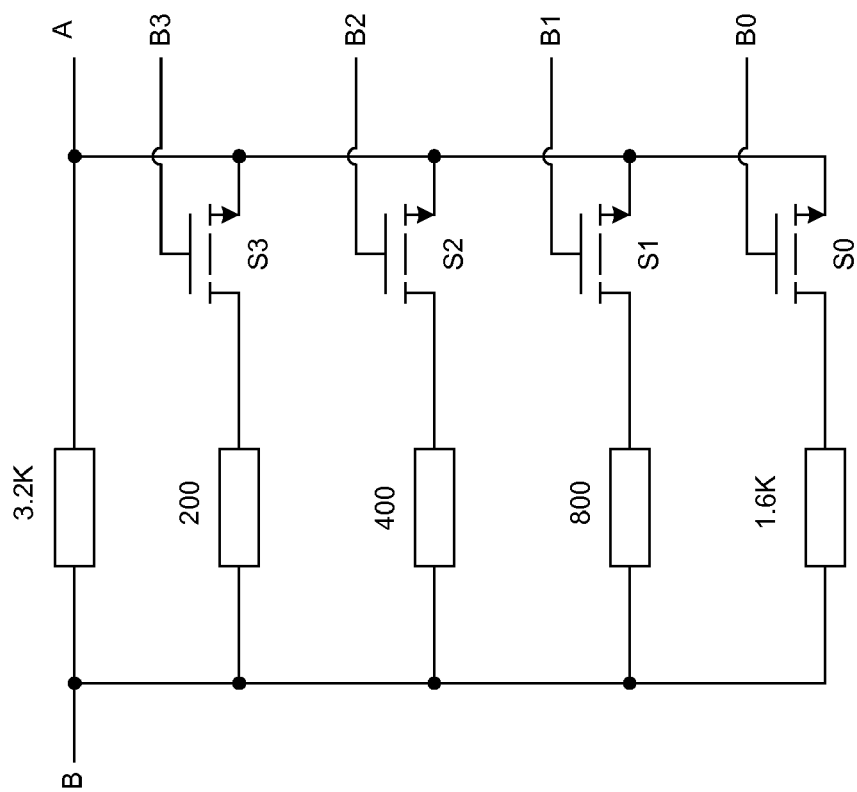
FIG. 3 illustrates a tunable resistor according to an exemplary embodiment of the present invention.
Figure 4:
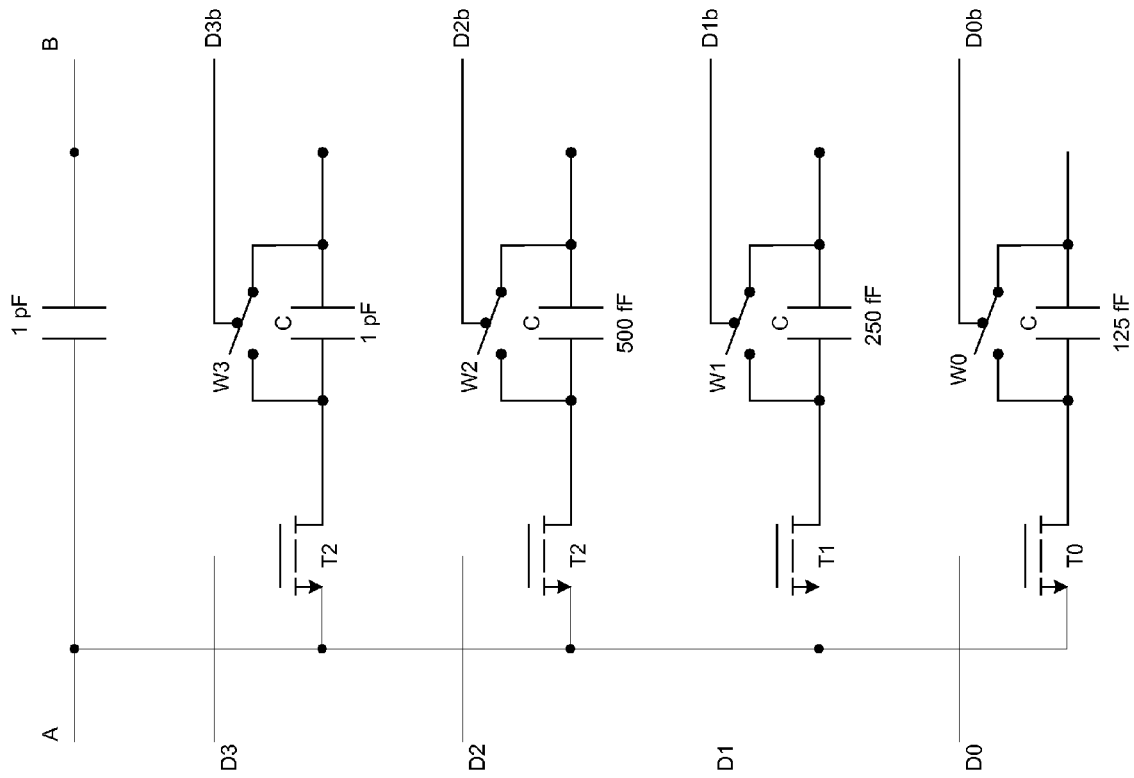
FIG. 4 illustrates a tunable capacitor according to an exemplary embodiment of the present invention.

To resonate, the resistors and capacitors placed in the differential position such as R56 and R58 or C48 and C50 in the resonator circuit may be matched. Thus, the inter-stage resistors 40, 42 may have an identical resistance R1, resistors 56, 58, 60, 62 may have an identical resistance R, and capacitors 48, 50, 52, 54 may have an identical capacitance C. During operation, under an ideal situation, a voltage transfer function from the input of the resonator (IN−, IN+) to the output (OUT+, OUT−) of the resonator may exhibit a band-pass characteristics with a resonance frequency at $\omega_0=1/(R*C)$. Further, the Q factor also may be indefinite. However, in practice, the resonance frequency $\omega_0$ may vary in a range such as from DC to 1 GHz to meet a wide tuning range of ADC. Thus, to have a varying $\omega_0$, the resistors 56, 58, 60, 62 and capacitors 48, 50, 52, 54 may be tunable resistors and/or tunable capacitors. These tunable resistors and capacitors may be implemented in different combinations, such as tunable resistors/tunable capacitors, tunable resistors/fixed capacitors, or fixed resistors/fixed capacitors. These tunable resistors and/or tunable capacitors may be realized via a set of digitally-controlled MOSFET switches. For example, FIG. 3 illustrates a tunable resistor according to an exemplary embodiment of the present invention, and FIG. 4 illustrates a tunable capacitor according to an exemplary embodiment of the present invention. In one exemplary embodiment, the terminal A of the tunable capacitor or the tunable resistor may be connected to the input terminals of the operational amplifiers 44, 46 while the terminal B of the tunable capacitor or the tunable resistor may be connected to output terminals of the operational amplifier 44, 46.

Referring to FIG. 3, a resistance of the tunable resistor structure between terminals A and B may be determined by switching the set of MOSFET switches S0, S1, S2, S3 controlled by the digital code (B3, B2, B1, B0). Thus, when the code is (0, 0, 0, 0), the resistance between terminals A and B may be the base resistance of 3.2 k ohms. When any of the digits D3, D2, D1, D0 becomes 1, the corresponding MOSFET switch may be turned on and the corresponding resistor may be parallelly added to the base resistor. Thus, the resistance between terminals A and B may be varied in a range from 1 k ohms to about 103 ohms (when the digital code is (1, 1, 1,1)). The control of these tunable resistors 56, 58, 60, 62 may be paired. Thus, in one embodiment, resistors 56, 58 may be controlled by one set of digit codes, while resistors 60, 62 may be controlled by another set of digit codes. In an alternative embodiment, resistors 56, 58, 60, 62 are all controlled by a same set of digit codes.

Referring to FIG. 4, a capacitance of the tunable capacitance structure between terminals A and B may similarly be determined by switching the set of MOSFET switches T0, T1, T2, T3 controlled by the digital code (D3, D2, D1, D0). Thus, when the code is (0, 0, 0, 0), the capacitance between terminals A and B may be the base capacitance of 1 pF. When any of the digits D3, D2, D1, D0 becomes 1, the corresponding MOSFET switch may be turned on and the corresponding capacitor may be parallelly added to the base capacitor. Thus, the resistance between terminals A and B may be varied in a range from 1 pF to about 2.875 pF (when the digital code is (1, 1, 1, 1)). The digit code (D3, D2, D1, D0) for controlling the set of MOSFET switches T0, T1, T2, T3 of the tunable capacitors may be generated independently from the digit code (B3, B2, B1, B0) for controlling the set of MOSFET switches S0, S1, S2, S3 of the tunable resistors. Similarly, The control of these tunable capacitors 48, 50, 52, 54 may be paired. Thus, in one embodiment, resistors 48, 50 may be controlled by one set of digit codes, while resistors 52, 54 may be controlled by another set of digit codes. In an alternative embodiment, resistors 48, 50, 52, 54 are all controlled by a same set of digit codes. The tunable capacitance structure also may include a set of small switches W0, W1, W2, W3 controlled by D0*b*, D1*b*, D2*b*, D3*b* that are the respective opposite states of D0, D1, D2, D3. The small switches W0, W1, W2, W3 may ensure the left-side terminals of the tunable capacitors not floating.

Figure 5:
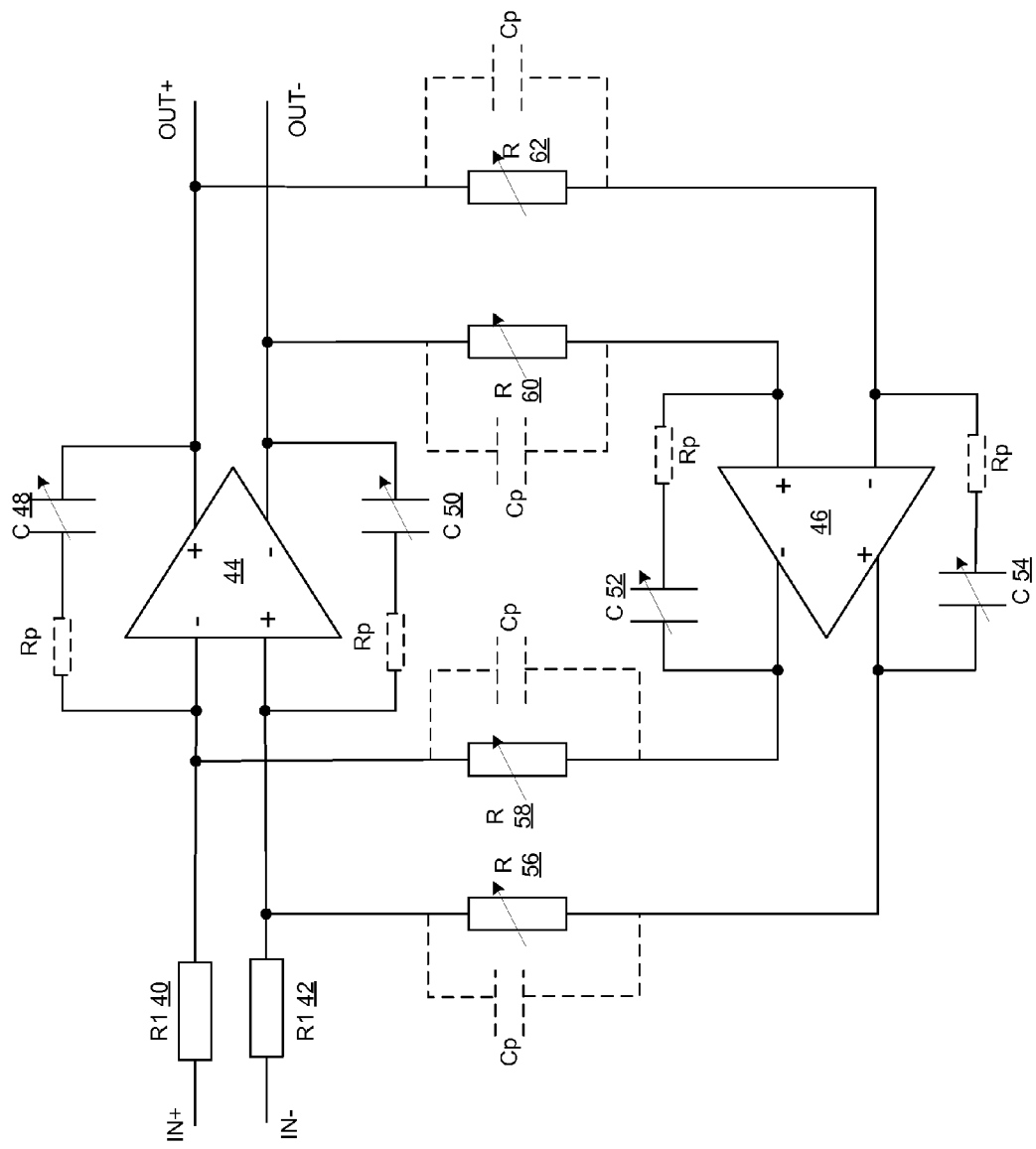
FIG. 5 illustrates an active RC resonator with parasitic components.

The switching of the MOSFET switches to vary the capacitors and/or resistors may at the same time generate parasitic resistance and parasitic capacitance. These parasitic resistance and parasitic capacitance may degrade the Q factor of a resonator. FIG. 5 illustrates an active RC resonator with parasitic components that may degrade the Q factor of the active RC resonator. For example, a parasitic resistor Rp may be generated during the ON state of MOSFET switches and be serially connected to any one of the capacitors 48, 50, 52, 54, and a parasitic capacitor Cp may be generated during the OFF state of MOSFET switches and parallelly connected to the tunable resistors 56, 58, 60, 62. The Q factor taking into account of these parasitic resistance and capacitance may be $Q \approx RC/(2*R*Cp+2*Rp*C)$.

The parasitic capacitance and resistance may vary based on the resonance frequency. Thus, the Q factor degradation also may vary at different resonance frequency. In the worst scenario when the resonance frequency is at 1 GHz, the width of the MOSFET switch may need to be 15 times larger than an acceptable width to achieve a Q factor=30. Thus, increasing the width of MOSFET switch may not be a realistic solution in practice. Other techniques may be needed to enhance the Q factor of an RC-active resonator.

Figure 6:
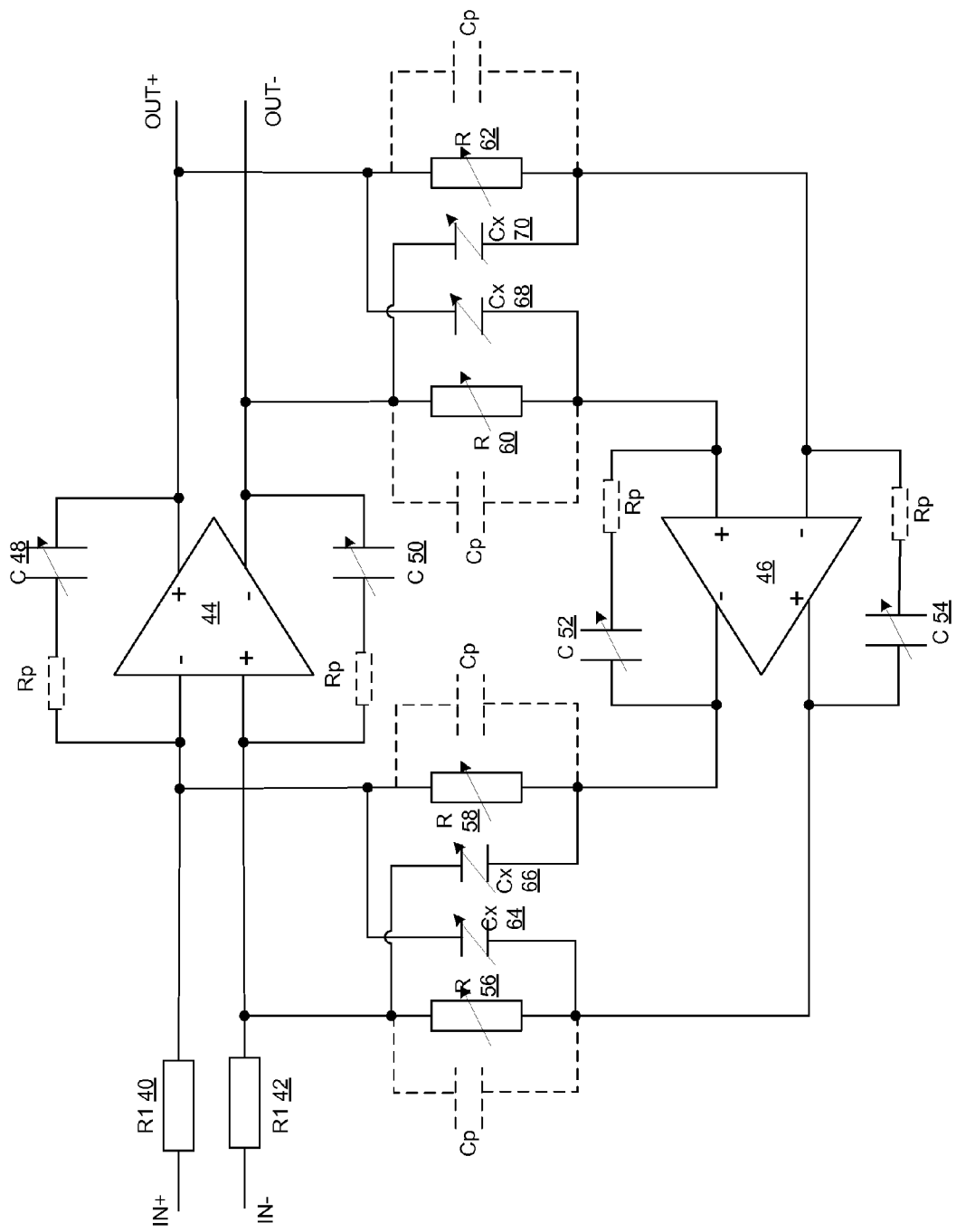
FIG. 6 illustrates an active RC resonator having Q factor enhancement according to an exemplary embodiment of the present invention.

FIG. 6 illustrates an active RC resonator having Q factor enhancement according to an exemplary embodiment of the present invention. Cancelling capacitors Cx 64, 66, 68, 70 may be introduced to generate a negative current to counter the effects of parasitic capacitors Cp and resistors Rp. Thus, to counter the parasitic capacitor associated with resistor 58, a cancelling capacitor 64 may be coupled from the second output (+) of the second operational amplifier 46 to the second input (negative summing node) of the first operational amplifier 44. Thus, the currents to the negative summing node of the first operational amplifier 44 may become Vout/Cx−Vout/Cp=Vout*(1/Cx−1/Cp). If the tunable Cx is selected substantially matching Cp based on the resonance frequency, the cancelling capacitor Cx may substantially cancel the effect of the parasitic capacitor associated with the resistor 58. Further, Cx may be selected larger than Cp to cancel the effect of Rp connected to the negative summing node of the first operational amplifier 44. In the event that Cp=0 (or resistors are fixed), the cancelling capacitor Cx may be designed to cancel Rp. For each parasitic capacitor, a cancelling capacitor may be introduced to cancel the effect of the parasitic capacitor. Thus, another cancelling capacitor 66 may be coupled from the first output (−) of the second operational amplifier 46 to the first input (positive summing node) of the first operational amplifier 44 to cancel the effect to the parasitic capacitor associated with resistor 56 and the parasitic resistor connected to the positive summing node of the first operational amplifier 44. Yet another cancelling capacitor 68 may be coupled from the second output (+) of the first operational amplifier 44 to the first input (positive summing node) of the second operational amplifier 46 to cancel the effect of the parasitic capacitor associated with resistor 60 and the parasitic resistor connected to the positive summing node of the second operational amplifier 46. Still another cancelling capacitor 70 may be coupled from the first output (−) of first operational amplifier 44 to the second input (negative summing node) of the second operational amplifier 46 to cancel the effect of the parasitic capacitor associated with the resistor 62 and the parasitic resistor connected to the negative summing node of the second operational amplifier 46.

In a preferred embodiment of the present invention, all cancelling capacitors 64, 66, 68, 70 may be used to achieve the largest improvement of the Q factor. However, the usage of any one pair of the cancelling capacitor pairs of capacitors 64, 66, or of capacitors 68, 70 may improve the Q factor of the active RC resonator. In one embodiment, each of the cancelling capacitors 64, 66, 68, 70 may be realized in a tunable structure similar to FIG. 4 with capacitances selected in such a way that they may substantially match the parasitic capacitance and parasitic resistance that they intend to cancel. For example, capacitors 64, 66 may be matched to parasitic capacitances generated by the tunable resistors 58, 56, respectively, and capacitors 68, 70 may be matched to parasitic capacitances generated by the tunable resistors 62, 60, respectively.

The active RC resonators discussed in this application are for illustration. Embodiments of the present invention are not limited by the particular type of active RC resonators illustrated in this application. The principles of the present invention may be applied to other types of RC resonators including quadrature resonators.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:
1. An active RC resonator, comprising:
a first differential integrator;
a second differential integrator, wherein first and second inputs of the first differential integrator are respectively coupled to second and first outputs of the second differential integrator via first and second signal paths, and first and second outputs of the first differential integrator are respectively coupled to first and second inputs of the second differential integrator via third and fourth signal paths, each of the first, second, third, and fourth signal paths including a respective resistor; and
at least one of:
1) a first capacitor coupled from the first output of the second differential integrator to the first input of the first differential integrator, and a second capacitor coupled from the second output of the second differential integrator to the second input of the first differential integrator,
2) a third capacitor coupled from the first output of the first differential integrator to the second input of the second differential integrator, and a fourth capacitor coupled from the second output of the first differential integrator to the first input of the second differential integrator.

2. The active RC resonator of claim 1, wherein each of the resistors in the first, second, third, and fourth signal paths is a tunable resistor, and wherein the tunable resistors in the first and the second signal paths have a first resistance, and the tunable resistors in the third and the fourth signal paths have a second resistance.

3. The active RC resonator of claim 2, wherein the tunable resistors in the first, second, third, and fourth signal paths vary the resistance by switching a set of MOSFET switches, and wherein the switching generates parasitic capacitances to each of the tunable resistors in the first, second, third, and fourth signal paths.

4. The active RC resonator of claim 3, wherein the first, second, third, and fourth capacitors are tunable capacitors.

5. An active RC resonator, comprising:
a first differential integrator;
a second differential integrator, wherein first and second inputs of the first differential integrator are respectively coupled to second and first outputs of the second differential integrator via first and second signal paths, and first and second outputs of the first differential integrator are respectively coupled to first and second inputs of the second differential integrator via third and fourth signal paths; and
at least one of:
1) a first capacitor coupled from the first output of the second differential integrator to the first input of the first differential integrator, and a second capacitor coupled from the second output of the second differential integrator to the second input of the first differential integrator,
2) a third capacitor coupled from the first output of the first differential integrator to the second input of the second differential integrator, and a fourth capacitor coupled from the second output of the first differential integrator to the first input of the second differential integrator,
wherein capacitances of the first and second capacitors are set to a level such that the set capacitances of the first and the second capacitors equal or substantially equal the parasitic capacitance in the first and second signal paths, wherein capacitances of the third and fourth capacitors are set to a level such that the set capacitances of the third and fourth capacitors equal or substantially equal the parasitic capacitances in the fourth and third signal paths.

6. An active RC resonator, comprising:
a first differential integrator;
a second differential integrator, wherein first and second inputs of the first differential integrator are respectively coupled to second and first outputs of the second differential integrator via first and second signal paths, and first and second outputs of the first differential integrator are respectively coupled to first and second inputs of the second differential integrator via third and fourth signal paths; and
at least one of:
  1) a first capacitor coupled from the first output of the second differential integrator to the first input of the first differential integrator, and a second capacitor coupled from the second output of the second differential integrator to the second input of the first differential integrator,
  2) a third capacitor coupled from the first output of the first differential integrator to the second input of the second differential integrator, and a fourth capacitor coupled from the second output of the first differential integrator to the first input of the second differential integrator,
wherein capacitances of the first and second capacitors are set to a level such that the set capacitances of the first and the second capacitors are larger than the parasitic capacitance in the first and second signal paths, wherein capacitances of the third and fourth capacitors are set to a level such that the set capacitances of the third and fourth capacitors are larger than the parasitic capacitances in the fourth and third signal paths.

7. An active RC resonator, comprising:
a first operational amplifier having first and second inputs and first and second outputs;
a second operational amplifier having first and second inputs and first and second outputs;
a first resistor coupled between the first input of the first operational amplifier and the second output of the second operational amplifier;
a second resistor coupled between the second input of the first operational amplifier and the first output of the second operational amplifier;
a third resistor coupled between the first output of the first operational amplifier and the first input of the second input of the second operational amplifier;
a fourth resistor coupled between the second output of the first operational amplifier and the second input of the second operational amplifier; and
at least one of:
  1) a first capacitor coupled between the first input of the first operational amplifier and the first output of the second operational amplifier, and a second capacitor coupled between the second input of the first operational amplifier and the second output of the second operational amplifier,
  2) a third capacitor coupled between the second output of the first operational amplifier and the first input of the second operational amplifier, and a fourth capacitor coupled between the first output of the first operational amplifier and the second input of the second operational amplifier.

8. The active RC resonator of claim 7, wherein the first and second resistors are tunable resistors and have a first resistance, and the third and fourth resistors are tunable resistors and have a second resistance.

9. The active RC resonator of claim 8, wherein the first, second, third, and fourth tunable resistors vary the resistance by switching a set of MOSFET switches, and wherein the switching generates parasitic capacitances to each of the first, second, third, and fourth tunable resistors.

10. The active RC resonator of claim 9, wherein the first, second, third, and fourth capacitors are tunable capacitors.

11. The active RC resonator of claim 10, wherein capacitances of the first and second capacitors are set to a level such that the set capacitances of the first and the second capacitors equal or substantially equal the parasitic capacitances associated with the first and second resistors, wherein capacitances of the third and fourth capacitors are set to a level such that the set capacitances of the third and fourth capacitors equal or substantially equal the parasitic capacitances associated with the third and fourth resistors.

12. The active RC resonator of claim 10, wherein capacitances of the first and second capacitors are set to a level such that the set capacitances of the first and the second capacitors are larger than the parasitic capacitances associated with the first and second resistors, wherein capacitances of the third and fourth capacitors are set to a level such that the set capacitances of the third and fourth capacitors are larger than the parasitic capacitances associated with the third and fourth resistors.

13. A loop filter, comprising:
an active RC resonator that includes:
  a first differential integrator;
  a second differential integrator, wherein first and second inputs of the first differential integrator are respectively coupled to second and first outputs of the second differential integrator via first and second signal paths, and first and second outputs of the first differential integrator are respectively coupled to first and second inputs of the second differential integrator via third and fourth signal paths, each of the first, second, third, and fourth signal paths including a respective resistor; and
  at least one of:
    1) a first capacitor coupled from the first output of the second differential integrator to the first input of the first differential integrator, and a second capacitor coupled from the second output of the second differential integrator to the second input of the first differential integrator,
    2) a third capacitor coupled from the first output of the first differential integrator to the second input of the second differential integrator, and a fourth capacitor coupled from the second output of the first differential integrator to the first input of the second differential.

14. A loop filter, comprising:
an active RC resonator that includes:
  a first operational amplifier having first and second inputs and first and second outputs;
  a second operational amplifier having first and second inputs and first and second outputs;
  a first resistor coupled between the first input of the first operational amplifier and the second output of the second operational amplifier;
  a second resistor coupled between the second input of the first operational amplifier and the first output of the second operational amplifier;

a third resistor coupled between the first output of the first operational amplifier and the first input of the second input of the second operational amplifier;

a fourth resistor coupled between the second output of the first operational amplifier and the second input of the second operational amplifier; and at least one of:
1) a first capacitor coupled between the first input of the first operational amplifier and the first output of the second operational amplifier, and a second capacitor coupled between the second input of the first operational amplifier and the second output of the second operational amplifier,
2) a third capacitor coupled between the second output of the first operational amplifier and the first input of the second operational amplifier, and a fourth capacitor coupled between the first output of the first operational amplifier and the second input of the second operational amplifier.

15. An analog-to-digital converter, comprising:

at least one loop filter, wherein the at least one loop filter includes:
   an active RC resonator that includes:
      a first differential integrator;
      a second differential integrator, wherein first and second inputs of the first differential integrator are respectively coupled to second and first outputs of the second differential integrator via first and second signal paths, and first and second outputs of the first differential integrator are respectively coupled to first and second inputs of the second differential integrator via third and fourth signal paths, each of the first, second, third, and fourth signal paths including a respective resistor; and
      at least one of:
         1) a first capacitor coupled from the first output of the second differential integrator to the first input of the first differential integrator, and a second capacitor coupled from the second output of the second differential integrator to the second input of the first differential integrator,
         2) a third capacitor coupled from the first output of the first differential integrator to the second input of the second differential integrator, and a fourth capacitor coupled from the second output of the first differential integrator to the first input of the second differential integrator.

16. An analog-to-digital converter, comprising:

at least one loop filter, wherein the at least one loop filter includes:
   an active RC resonator that includes:
      a first operational amplifier having first and second inputs and first and second outputs;
      a second operational amplifier having first and second inputs and first and second outputs;
      a first resistor coupled between the first input of the first operational amplifier and the second output of the second operational amplifier;
      a second resistor coupled between the second input of the first operational amplifier and the first output of the second operational amplifier;
      a third resistor coupled between the first output of the first operational amplifier and the first input of the second input of the second operational amplifier;
      a fourth resistor coupled between the second output of the first operational amplifier and the second input of the second operational amplifier; and
      at least one of:
         1) a first capacitor coupled between the first input of the first operational amplifier and the first output of the second operational amplifier, and a second capacitor coupled between the second input of the second operational amplifier and the first output of the second operational amplifier,
         2) a third capacitor coupled between the second output of the first operational amplifier and the first input of the second operational amplifier, and a fourth capacitor coupled between the first output of the first operational amplifier and the second input of the second operational amplifier.

* * * * *